(12) United States Patent
Shang et al.

(10) Patent No.: US 12,266,397 B2
(45) Date of Patent: Apr. 1, 2025

(54) AMPLIFICATION CIRCUIT, CONTROL METHOD, AND MEMORY

(71) Applicant: CHANGXIN MEMORY TECHNOLOGIES, INC., Hefei (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 172 days.

(21) Appl. No.: 18/151,464

(22) Filed: Jan. 8, 2023

(65) Prior Publication Data

US 2023/0238054 A1    Jul. 27, 2023

Related U.S. Application Data

(63) Continuation of application No. PCT/CN2022/077786, filed on Feb. 24, 2022.

(30) Foreign Application Priority Data

Jan. 27, 2022    (CN) .......................... 202210102965.6

(51) Int. Cl.
     *G11C 11/00*      (2006.01)
     *G11C 11/4074*      (2006.01)
     (Continued)

(52) U.S. Cl.
     CPC ...... *G11C 11/4091* (2013.01); *G11C 11/4074* (2013.01); *G11C 11/4094* (2013.01)

(58) Field of Classification Search
     CPC . G11C 11/4091; G11C 11/4094; G11C 7/065; G11C 7/12; G11C 7/1048;
     (Continued)

(56) References Cited

U.S. PATENT DOCUMENTS

| 11,024,365 | B1 | 6/2021 | Seo |
| 2016/0092130 | A1 | 3/2016 | Choi |

(Continued)

FOREIGN PATENT DOCUMENTS

| CN | 105469824 A | 4/2016 |
| CN | 108257631 A | 7/2018 |

(Continued)

OTHER PUBLICATIONS

US office action in U.S. Appl. No. 18/095,364, mailed on Oct. 1, 2024.

*Primary Examiner* — Thong Q Le
(74) *Attorney, Agent, or Firm* — Syncoda LLC; Feng Ma

(57) ABSTRACT

An amplification circuit includes: a sense amplification circuit including a read node, a complementary read node, a first node and a second node; an isolation circuit, which couples the read node to a bit line and couples the complementary read node to a complementary bit line in a sense amplification stage; an offset cancellation circuit, which couples the bit line to the complementary read node and couple the complementary bit line to read node in an offset cancellation stage; and a first power supply circuit, coupled to the first node, including a first power supply and a second power supply, a power supply voltage of the first power supply being higher than that of the second power supply, the first power supply circuit couples the first power supply to the first node in offset cancellation stage, and couples the second power supply to the first node in sense amplification stage.

19 Claims, 9 Drawing Sheets

(51) Int. Cl.
*G11C 11/4091* (2006.01)
*G11C 11/4094* (2006.01)

(58) Field of Classification Search
CPC ... G11C 11/4074; G11C 7/08; G11C 11/4076; G11C 11/4093; G11C 11/565; G11C 7/04; G11C 7/06; G11C 7/067; G11C 7/1069; G11C 11/4063; G11C 2207/002; G11C 7/02; G11C 7/10; G11C 7/1045; G11C 7/1051; G11C 7/1078; G11C 7/22; G11C 11/4096; G11C 16/0483; G11C 16/08; G11C 16/24; G11C 7/18
See application file for complete search history.

(56) References Cited

U.S. PATENT DOCUMENTS

| | | | |
|---|---|---|---|
| 2018/0061461 A1 | 3/2018 | Seo | |
| 2018/0182449 A1 | 6/2018 | Kim et al. | |
| 2018/0293029 A1 | 10/2018 | Achtenberg et al. | |
| 2018/0330766 A1 | 11/2018 | Ingalls et al. | |
| 2019/0147925 A1 | 5/2019 | Choi et al. | |
| 2019/0156869 A1 | 5/2019 | Ingalls et al. | |
| 2019/0180811 A1 | 6/2019 | Kim et al. | |
| 2020/0118609 A1 | 4/2020 | Brox et al. | |
| 2020/0118614 A1 | 4/2020 | Kim et al. | |
| 2020/0143869 A1 | 5/2020 | Seo et al. | |
| 2020/0227111 A1 | 7/2020 | Kim et al. | |
| 2020/0372948 A1 | 11/2020 | Kim et al. | |
| 2021/0241818 A1* | 8/2021 | Lee | G11C 11/565 |
| 2021/0272618 A1 | 9/2021 | Kim et al. | |
| 2022/0172757 A1 | 6/2022 | Brox et al. | |

FOREIGN PATENT DOCUMENTS

| | | |
|---|---|---|
| CN | 109767799 A | 5/2019 |
| CN | 110574109 A | 12/2019 |
| CN | 110992997 A | 4/2020 |
| CN | 111081296 A | 4/2020 |
| CN | 111161764 A | 5/2020 |
| CN | 111292783 A | 6/2020 |
| CN | 112767975 A | 5/2021 |
| CN | 112997250 A | 6/2021 |

* cited by examiner

AMPLIFICATION CIRCUIT, CONTROL METHOD, AND MEMORY

CROSS-REFERENCE TO RELATED APPLICATIONS

This is a continuation of International Application No. PCT/CN2022/077786 filed on Feb. 24, 2022, which claims priority to Chinese Patent Application No. 202210102965.6 filed on Jan. 27, 2022. The disclosures of the above-referenced applications are hereby incorporated by reference in their entirety.

BACKGROUND

A dynamic random access memory (DRAM) stores data through charges in a unit capacitor. The unit capacitor couples a bit line and a complementary bit line. In the DRAM, when a read/write operation or a refresh operation is performed, an amplification circuit needs to read and amplify a voltage difference between the bit line and the complementary bit line.

Transistors constituting the amplification circuit may have different device characteristics due to factors such as process variations and the temperature. For example, transistors matching each other have different threshold voltages, and such different device characteristics cause generation of offset noise in the amplification circuit. Due to existence of the offset noise in the amplification circuit, the effective readout margin of the amplification circuit is decreased, which consequently decreases the performance of the DRAM.

SUMMARY

This disclosure relates to the field of semiconductor circuit design, and in particular, to an amplification circuit, a control method, and a memory.

By adding an offset cancellation stage before a sense amplification stage, offset noise in an amplification circuit is eliminated. However, the offset cancellation stage requires additional data processing duration, which affects the data processing time sequence of a memory. How to reduce the processing duration of the offset cancellation stage while ensuring the accuracy of offset cancellation is of great significance to the performance improvement of the memory.

An embodiment of this disclosure provides an amplification circuit which is coupled to a bit line and a complementary bit line, and includes: a sense amplification circuit, an isolation circuit, an offset cancellation circuit and a first power supply circuit. The sense amplification circuit includes a read node, a complementary read node, a first node, and a second node. In a sense amplification stage and an offset cancellation stage, the first node is configured to receive a high level, and the second node is configured to receive a low level. The isolation circuit is coupled to the read node, the complementary read node, the bit line, and the complementary bit line. The isolation circuit is configured to: in the sense amplification stage, couple the read node to the bit line and couple the complementary read node to the complementary bit line. The offset cancellation circuit, is coupled to the read node, the complementary read node, the bit line, and the complementary bit line. The offset cancellation circuit is configured to: in the offset cancellation stage, couple the bit line to the complementary read node and couple the complementary bit line to the read node. The first power supply circuit is coupled to the first node, and includes a first power supply and a second power supply. A power supply voltage of the first power supply is higher than a power supply voltage of the second power supply. The first power supply circuit is configured to: couple the first power supply to the first node in the offset cancellation stage, and couple the second power supply to the first node in the sense amplification stage.

An embodiment of this disclosure provides a control method, applied to the amplification circuit provided in the foregoing embodiment, the method includes: providing a high level to a first node based on a first power supply in an offset cancellation stage; and providing a high level to the first node based on a second power supply in a sense amplification stage, where a power supply voltage of the first power supply is higher than a power supply voltage of the second power supply.

An embodiment of this disclosure provides a memory which includes the amplification circuit provided in the foregoing embodiment, where the amplification circuit is configured to perform a read/write operation of data.

BRIEF DESCRIPTION OF THE DRAWINGS

One or more embodiments are exemplarily described with reference to corresponding figures in the accompanying drawings, and the exemplary descriptions are not to be construed as limiting the embodiments. Unless otherwise particularly stated, the figures in the accompanying drawings are not drawn to scale. To describe the technical solutions in the embodiments of this disclosure or in the conventional technology more clearly, the following briefly introduces the accompanying drawings required for describing the embodiments. Apparently, the accompanying drawings in the following description show only some embodiments of this disclosure, and a person of ordinary skill in the art may still derive other drawings from these accompanying drawings without creative efforts.

DETAILED DESCRIPTION

Transistors constituting an amplification circuit may have different device characteristics due to factors such as process variations and the temperature. For example, transistors matching each other have different threshold voltages, and such different device characteristics cause generation of offset noise in the amplification circuit. Due to existence of the offset noise in the amplification circuit, the effective readout margin of the amplification circuit is decreased, which consequently decreases the performance of a DRAM.

By adding an offset cancellation stage before a sense amplification stage, offset noise in an amplification circuit is eliminated. However, the offset cancellation stage requires additional data processing duration, which affects the data processing time sequence of a memory. How to ensure the accuracy of offset cancellation and reduce the processing duration of the offset cancellation stage is of great significance to the performance improvement of the memory.

An embodiment of this disclosure provides an amplification circuit, which shortens the processing duration of the offset cancellation stage while ensuring the accuracy of offset cancellation, thereby optimizing the performance of the memory.

A person of ordinary skill in the art can understand that, in the embodiments of this disclosure, many technical details are provided for readers to better understand this disclosure. However, even without these technical details and various changes and modifications based on the following embodiments, the technical solutions claimed in this disclosure may still be realized. The division of the following embodiments is for convenience of description, and should not constitute any limitation to the specific implementations of this disclosure, and the various embodiments may be combined with each other without contradiction.

Figure 1:
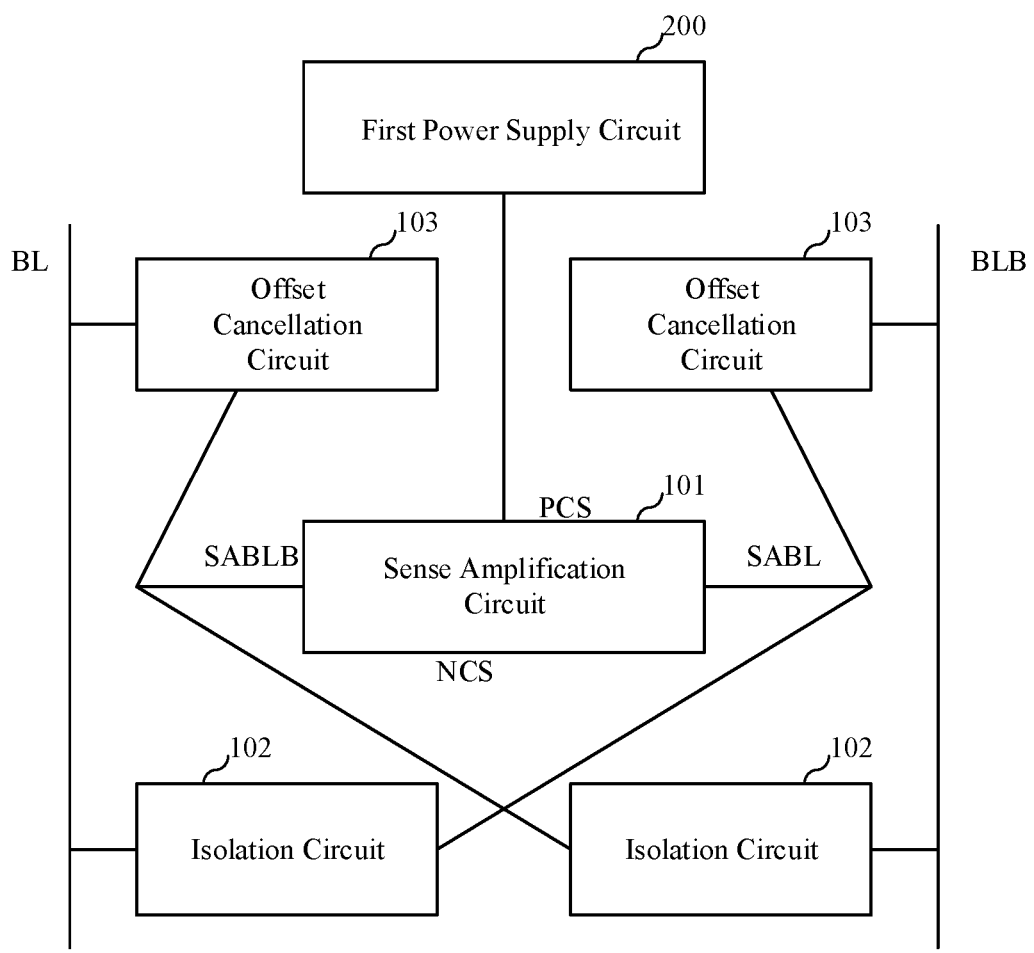
FIG. 1 is a schematic diagram of a virtual structure of an amplification circuit according to an embodiment of this disclosure.
Figure 2:
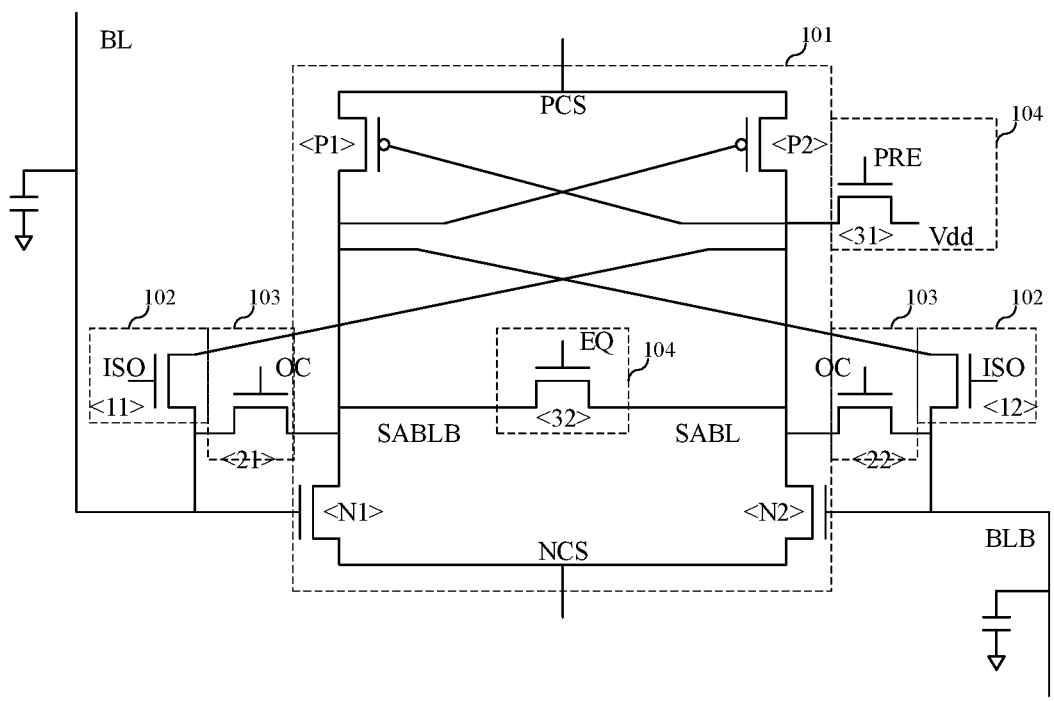
FIG. 2 is a schematic diagram of a circuit structure of an amplification circuit according to an embodiment of this disclosure.
Figure 3:
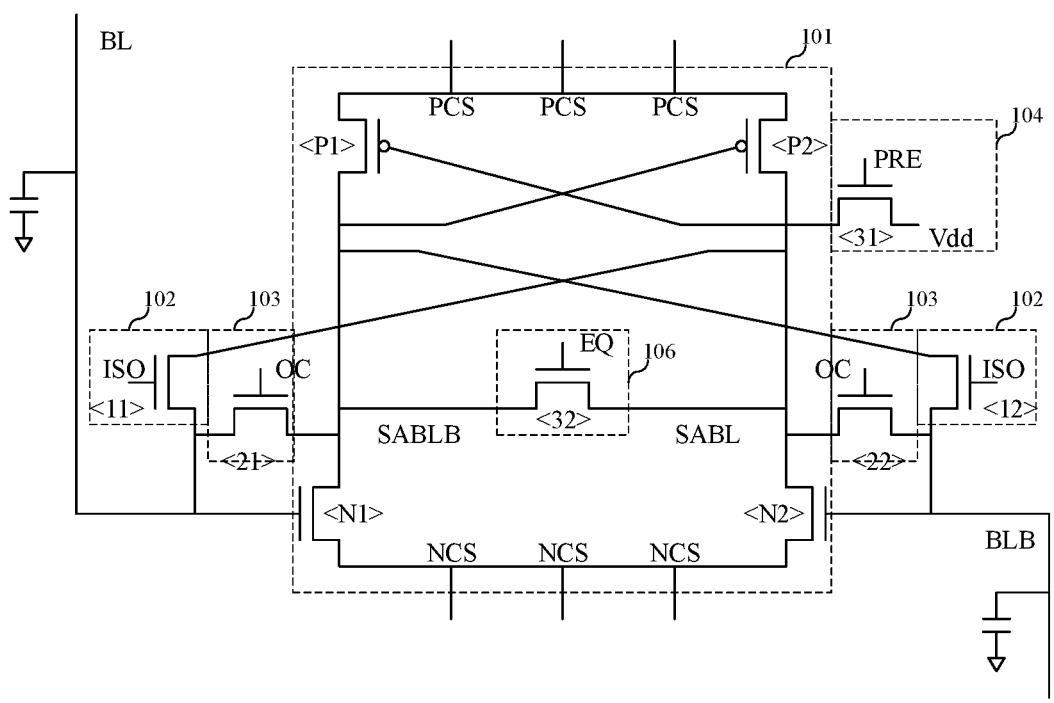
FIG. 3 is a schematic diagram of another circuit structure of an amplification circuit according to an embodiment of this disclosure.
Figure 4:
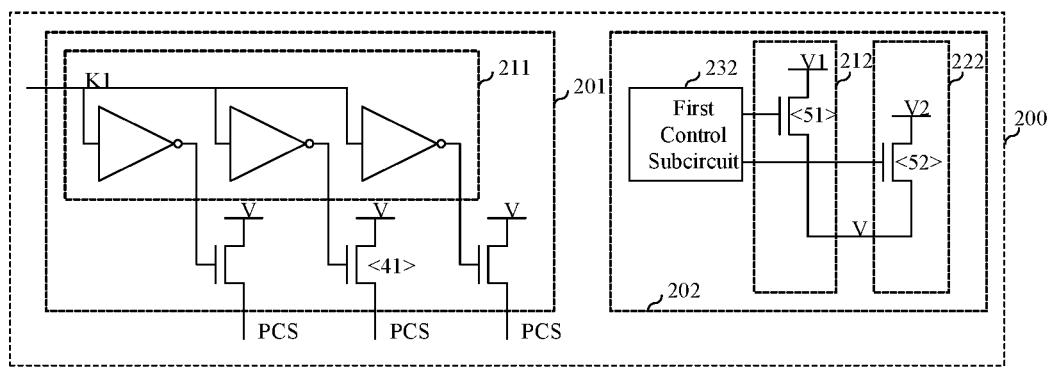
FIG. 4 is schematic structural diagram of a first power supply circuit according to an embodiment of this disclosure.
Figure 5:
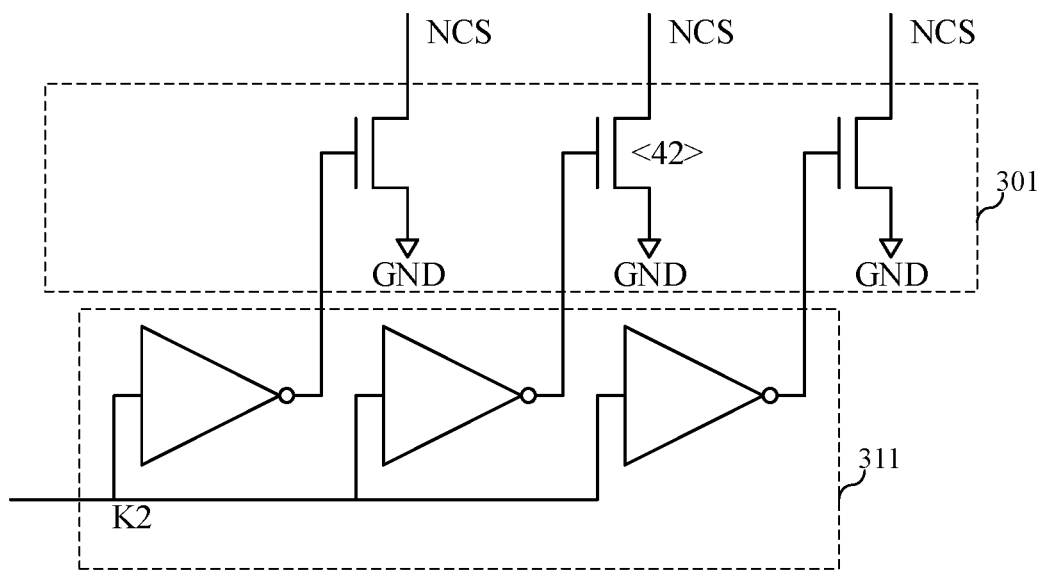
FIG. 5 is schematic structural diagram of a second power supply control circuit according to an embodiment of this disclosure.
Figure 6:
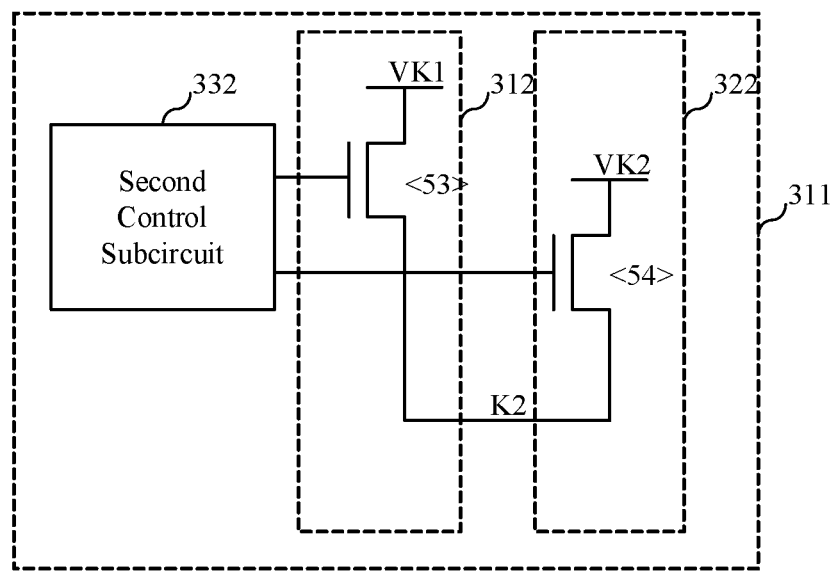
FIG. 6 is schematic structural diagram of a second selection circuit according to an embodiment of this disclosure.

FIG. 1 is a schematic diagram of a virtual structure of an amplification circuit according to this embodiment; FIG. 2 is a schematic diagram of a circuit structure of an amplification circuit according to this embodiment; FIG. 3 is a schematic diagram of another circuit structure of an amplification circuit according to this embodiment; FIG. 4 is schematic structural diagram of a first power supply circuit according to this embodiment; FIG. 5 is schematic structural diagram of a second power supply control circuit according to this embodiment; and FIG. 6 is schematic structural diagram of a second selection circuit according to this embodiment. The following further describes the amplification circuit provided in this embodiment in detail with reference to the accompanying drawings, which is specifically as follows:

Referring to FIG. 1 to FIG. 3, the amplification circuit is coupled to a bit line BL and a complementary bit line BLB, and includes a sense amplification circuit 101, an isolation circuit 102, an offset cancellation circuit 103 and a first power supply circuit 200.

The sense amplification circuit 101 includes a read node SABL, a complementary read node SABLB, a first node PCS, and a second node NCS. In a sense amplification stage and an offset cancellation stage, the first node PCS is configured to receive a high level, and the second node NCS is configured to receive a low level.

Specifically, the first node PCS is coupled to a power supply node to receive a high level provided by the power supply node; and the second node NCS is coupled to a ground node to receive a low level provided by the ground node.

The isolation circuit 102 is coupled to the read node SABL, the complementary read node SABLB, the bit line BL, and the complementary bit line BLB. The isolation circuit 102 is configured to: in the sense amplification stage, couple the read node SABL to the bit line BL and couple the complementary read node SABLB to the complementary bit line BLB.

The offset cancellation circuit 103 is coupled to the read node SABL, the complementary read node SABLB, the bit line BL, and the complementary bit line BLB. The offset cancellation circuit 103 is configured to: in the offset cancellation stage, couple the bit line BL to the complementary read node SABLB and couple the complementary bit line BLB to the read node SABL.

The first power supply circuit 200 is coupled to the first node PCS, and includes a first power supply and a second power supply. A power supply voltage of the first power supply is higher than a power supply voltage of the second power supply. The first power supply circuit is configured to: couple the first power supply to the first node PCS in the offset cancellation stage, and couple the second power supply to the first node PCS in the sense amplification stage.

In the offset cancellation stage, the first power supply is coupled to the first node PCS, a high level is provided to the first node PCS by using the first power supply, and a voltage difference between the first node PCS and the second node NCS is increased based on a high level provided via the first node PCS. In the sense amplification stage, the second power supply is coupled to the first node PCS, a high level is provided to the first node PCS by using the second power supply, and the sense amplification circuit amplifies the voltage difference between the bit line BL and the complementary bit line BLB based on a high level provided via the first node PCS. Compared with the manner of using the same power supply in the offset cancellation stage and the sense amplification stage, in this embodiment, the first power supply with a higher power supply voltage is provided in the offset cancellation stage since the power supply voltage of the first power supply is higher than the power supply voltage of the second power supply. In such a manner, a voltage difference between the first node PCS and the second node NCS in the offset cancellation stage is increased, to increase a rate at which the sense amplification circuit 101 generates a compensation voltage before performing voltage amplification, and to eliminate a deviation caused by transistor manufacturing differences in transistor pairs inside the amplification circuit, thereby reducing the time required for completing offset cancellation. Therefore, the duration of the offset cancellation stage can be shortened based on such memory design, to optimize the performance of the memory.

Referring to FIG. 2, the sense amplification circuit 101 shown in FIG. 2 merely includes one first node PCS and one second node NCS. Referring to FIG. 3, the sense amplification circuit 101 shown in FIG. 3 includes a plurality of first nodes PCS and a plurality of second nodes NCS, and the plurality of first nodes PCS and the plurality of second nodes NCS are used to provide a high level and a low level respectively. It should be noted that, the circuit structure shown in FIG. 3 is specifically described by using three first nodes PCS and three second nodes NCS as an example, which does not constitute a limitation to this embodiment.

Referring to FIG. 3 together with FIG. 4, the first power supply circuit 200 includes: a first power supply control circuit 201 and a first selection circuit 202.

The first power supply control circuit 201 is coupled to power supply nodes V and the first nodes PCS. The first power supply control circuit 201 is configured to couple the power supply nodes V to the first nodes PCS in the offset cancellation stage and the sense amplification stage; and The first selection circuit 202 is coupled to the power supply node V, and includes a first power supply V1 and a second power supply V2. The first selection circuit 202 is configured to: provide the first power supply V1 to the power supply node V in the offset cancellation stage, and provide the second power supply V2 to the power supply node V in the sense amplification stage.

Referring to FIG. 4, the first power supply control circuit 201 includes: first control transistors <41> and a pull-up control circuit 211. One of a pair of source/drain terminals of each first control transistor is coupled to one power supply node V, and the other one of the pair of the source/drain terminals is coupled to one first node PCS. The pull-up control circuit 211 is coupled to gates of the first control transistors <41>. The pull-up control circuit 211 is configured to turn on the first control transistors <41> in the offset cancellation stage and the sense amplification stage.

Specifically, the pull-up control circuit 211 is turned on based on a pull-up control signal K1. The pull-up control signal K1 is provided by a memory to which the amplification circuit belongs. In the offset cancellation stage and the sense amplification stage, the memory provides the pull-up control signal K1 to turn on the first control transistors <41>, to couple the power supply nodes V to the first nodes PCS.

In addition, this embodiment is described based on the circuit shown in FIG. 3, so that there are three controllers adapted to the three first nodes PCS in the circuit shown in FIG. 3 to realize control on the three first control transistors <41>. In some embodiments, the pull-up control signal K1 is further configured to select and turns on a first control transistor <41>.

It should be noted that, the first control transistor <41> may be an NMOS tube or a PMOS tube. Because the pull-up capability of the PMOS tube is stronger than the pull-up capability of the NMOS tube, the first control transistor <41> is set by using the PMOS tube in this embodiment.

Referring to FIG. 4, the first selection circuit 202 includes: a first control subcircuit 232, a first selection subcircuit 212 and which is a second selection subcircuit 222. The first control subcircuit 232 is configured to provide a first selection signal or a second selection signal based on a first control instruction. The first selection subcircuit 212 is coupled to the first control subcircuit 232, the power supply node V, and the first power supply V1. The first selection subcircuit 212 is configured to provide the first power supply V1 to the power supply node V based on the first selection signal. The second selection subcircuit 222 is coupled to the first control subcircuit 232, the power supply node V, and the second power supply V2. The second selection subcircuit 222 is configured to provide the second power supply V2 to the power supply node V based on the second selection signal.

Specifically, the first control subcircuit 232 generates a corresponding selection signal based on the first control instruction to turn on the first selection subcircuit 212 or the second selection subcircuit 222. The first control instruction is provided by the memory to which the amplification circuit belongs. In the offset cancellation stage and the sense amplification stage, the memory selects and turns on the first selection subcircuit 212 or the second selection subcircuit 222 based on the first control instruction, so as to provide the first power supply V1 to the first node PCS in the offset cancellation stage, and provide the second power supply V2 to the first node PCS in the sense amplification stage.

Referring to FIG. 4, the first selection subcircuit 212 includes a first selection transistor <51>. One of a pair of source/drain terminals of the first selection transistor <51> is coupled to the first power supply V1, the other one of the pair of the source/drain terminals of the first selection transistor <51> is coupled to the power supply node V, and a gate of the first selection transistor <51> is coupled to the first control subcircuit 232 and configured to receive the first selection signal. The second selection subcircuit 222 includes: a second selection transistor <52>. One of a pair of source/drain terminals of the second selection transistor <52> is coupled to the second power supply V2, the other one of the pair of the source/drain terminals of the second selection transistor <52> is coupled to the power supply node V, and a gate of the second selection transistor <52> is coupled to the first control subcircuit 232 and configured to receive the second selection signal.

Specifically, the first selection transistor <51> is turned on based on the first selection signal, to couple the first power supply V1 to the power supply node V; and the second selection transistor <52> is turned on based on the second selection signal, to couple the second power supply V2 to the power supply node V.

Referring to FIG. 5 and FIG. 6 together with FIG. 3, the amplification circuit further includes: a second power supply control circuit 301 and a second selection circuit 311. The second power supply control circuit 301 is coupled to ground nodes GND and the second nodes NCS. The second selection circuit 311 is coupled to the second power supply control circuit 301, and includes a first control power supply VK1 and a second control power supply VK2. A power supply voltage of the first control power supply VK1 is higher than a power supply voltage of the second control power supply VK2. The second selection circuit 311 is configured to: couple the first control power supply VK1 to the second power supply control circuit 301 in the offset cancellation stage, and couple the second control power supply VK2 to the second power supply control circuit 301 in the sense amplification stage. The second power supply control circuit 301 is configured to couple the ground node GND to the second node NCS based on the first control power supply VK1 or the second control power supply VK2.

In the offset cancellation stage, the ground node GND is coupled to the second node NCS via the first control power supply VK1, the ground node GND provides a low level to the second nodes NCS, and a voltage difference the first node PCS and the second node NCS is increased based on the low level provided by the second node NCS. In the sense amplification stage, the ground node GND is coupled to the second nodes NCS by using the second control power supply VK2, the ground node GND provides a low level to the second nodes NCS, and the sense amplification circuit 101 amplifies a voltage difference between the bit line BL and the complementary bit line BLB based on the low level provided by the second node NCS. Compared with the manner of using the same control power supply in the offset cancellation stage and the sense amplification stage, in this embodiment, the first control power supply VK1 with a higher power supply voltage is provided in the offset cancellation stage since the power supply voltage of the first control power supply VK1 is higher than the power supply voltage of the second control power supply VK2. In such a manner, a rate at which the sense amplification circuit 101 generates a compensation voltage before performing voltage amplification is increased, and a deviation caused by transistor manufacturing differences in transistor pairs inside the amplification circuit is eliminated, thereby reducing the time required for completing offset cancellation. Therefore, the dration of the offset cancellation stage can be shortened based on such memory design, to optimize the performance of the memory.

It should be noted that, in some embodiments, the performance of the memory can be optimized only by the first power supply circuit 200 provided above. In some embodiments, the performance of the memory can be optimized only by the second power supply control circuit 301 and the second selection circuit 311 provided above. In some embodiments, the first power supply circuit 200, the second power supply control circuit 301, and the second selection circuit 311 provided above may be implemented cooperatively to further optimize the performance of the memory.

Referring to FIG. 5, the second power supply control circuit 301 includes second control transistors <42>. One of a pair of source/drain terminals of each second control transistor is coupled to one second node NCS, the other one of the pair of the source/drain terminals of the second control transistor is coupled to one ground node GND, and a gate of the second control transistor is coupled to the second selection circuit 311.

Specifically, the second control transistor <42> is turned on based on a pull-down control signal K2 provided by the second selection circuit 311, where the pull-down control signal K2 is provided by the first control power supply VK1 or the second control power supply VK2. In the offset cancellation stage, the second control transistor <42> is turned on based on the pull-down control signal K2 provided by the first control power supply VK1, to couple the ground node GND to the second node NCS. In the sense amplification stage, the second control transistor <42> is turned on based on the pull-down control signal K2 provided by the second control power supply VK2, to couple the ground node GND to the second node NCS. Because the power supply voltage of the first control power supply VK1 is higher than the power supply voltage of the second control power supply VK2, a channel width of the second control transistor <42> in a case that the second control transistor <42> is turned on based on the first control power supply VK1 is greater than that in a case that the second control transistor <42> is turned on based on the second control power supply VK2.

It should be noted that, in this embodiment, an example in which the second control transistor <42> is turned on based on a high level, that is, the second control transistors <42> is a NMOS tube is used, which does not constitute a limitation to this embodiment. Because the pull-down capability of the NMOS tube is stronger than the pull-down capability of a PMOS tube, by setting the second control transistor <42> to the NMOS tube, the rate at which the sense amplification circuit 101 generates the compensation voltage before performing voltage amplification can be improved. In other embodiments, the second control transistor may alternatively be set to the PMOS tube. Correspondingly, the power supply voltage of the first control power supply is lower than the power supply voltage of the second control power supply.

Referring to FIG. 5 and FIG. 6, the second selection circuit 311 includes: a second control subcircuit 332, a third selection subcircuit 312 and a fourth selection subcircuit 322. The second control subcircuit 332 is configured to provide a third selection signal or a fourth selection signal based on a second control instruction. The third selection subcircuit 312 is coupled to the second control subcircuit 332, the first control power supply VK1, and the second power supply control circuit 301. The third selection subcircuit 312 is configured to provide the first control power supply VK1 to the second power supply control circuit 301 based on the third selection signal. The fourth selection subcircuit 322 is coupled to the second control subcircuit 332, the second control power supply VK2, and the second power supply control circuit 301 The fourth selection subcircuit 322 is configured to provide the second control power supply VK2 to the second power supply control circuit 301 based on the fourth selection signal.

Specifically, the second control subcircuit 332 generates a corresponding selection signal based on the second control instruction to turn on the third selection subcircuit 312 or the fourth selection subcircuit 322. The second control instruction is provided by the memory to which the amplification circuit belongs. In the offset cancellation stage and the sense amplification stage, the memory selects and turns on the third selection subcircuit 312 or the fourth selection subcircuit 322 based on the second control instruction, so as to couple the ground nodes GND to the second nodes NCS based on the first control power supply VK1 in the offset cancellation stage, and to couple the ground nodes GND to the second nodes NCS based on the second control power supply VK2 in the sense amplification stage.

Referring to FIG. 6, the third selection subcircuit 312 includes a third selection transistor <53>. One of a pair of source/drain terminals of the third selection transistor <53> is coupled to the first control power supply VK1, the other one of the t pair of source/drain terminals of the third selection transistor <53> is coupled to the second power supply control circuit 301, and a gate of the third selection transistor <53> is coupled to the second control subcircuit 311 and configured to receive the third selection signal. The fourth selection subcircuit 322 includes a fourth selection transistor <54>. One of a pair of source/drain terminals of the fourth selection transistor <54> is coupled to the second control power supply VK2, the other one of the t pair of source/drain terminals of the fourth selection transistor <54> is coupled to the second power supply control circuit 301, and a gate of the fourth selection transistor <54> is coupled to the second control subcircuit 311 and configured to receive the fourth selection signal.

Specifically, the third selection transistor <53> is turned on based on the third selection signal, to couple the first control power supply VK1 to the second power supply control circuit 301; and the fourth selection transistor <54> is turned on based on the fourth selection signal, to couple the second control power supply VK2 to the second power supply control circuit 301.

Referring to FIG. 2 and FIG. 3, in this embodiment, the sense amplification circuit 101 includes: a first P-type transistor <P1>, a second P-type transistor <P2>, a first N-type transistor <N1> and a second N-type transistor <N2>. One of a pair of source/drain terminals of the first P-type transistor <P1> is coupled to the first node PCS, the other one of the pair of source/drain terminals of the first P-type transistor <P1> is coupled to the complementary read node SABLB, and a gate of the first P-type transistor <P1> is coupled to the read node SABL. One of a pair of source/drain terminals of the second P-type transistor <P2> is coupled to the first node PCS, the other one of the pair of the source/drain terminals of the second P-type transistor <P2> is coupled to the read node SABL, and a gate of the second P-type transistor <P2> is coupled to the complementary read node SABLB. One of a pair of source/drain terminals of the first N-type transistor <N1> is coupled to the second node NCS, the other one of the pair of the source/drain terminals of the first N-type transistor <N1> is coupled to the complementary read node SABLB, and a gate of the first N-type transistor <N1> is coupled to the bit line BL. One of a pair of source/drain terminals of the second N-type transistor <N2> is coupled to the second node NCS, the other one of the pair of the source/drain terminals of the second N-type transistor <N2> is coupled to the read node SABL, and a gate of the second N-type transistor <N2> is coupled to the complementary bit line BLB.

Referring to FIG. 2 and FIG. 3, in this embodiment, the isolation circuit 102 includes: a first isolation transistor <11> and a second isolation transistor <12>. One of a pair of source/drain terminals of the first isolation transistor <11> is coupled to the bit line BL, the other one of the pair of the source/drain terminals of the first isolation transistor <11> is coupled to the read node SABL, and a gate of the first isolation transistor <11> is configured to receive an isolation signal ISO. The first isolation transistor <11> is configured to be turned on based on the isolation signal ISO in the sense amplification stage, to couple the read node SABL to the bit line BL, One of a pair of source/drain terminals of the second isolation transistor <12> is coupled to the complementary bit line BLB, the other one of the pair of the source/drain terminals of the second isolation transistor <12> is coupled to the complementary read node SABLB, and a gate of the second isolation transistor <12> is configured to receive the isolation signal ISO. The second isolation transistor <12> is configured to be turned on based on the isolation signal ISO in the sense amplification stage, to couple the complementary read node SABLB to the complementary bit line BLB.

Referring to FIG. 2 and FIG. 3, in this embodiment, the offset cancellation circuit 103 includes: a first offset cancellation transistor <21> and a second offset cancellation transistor <22>. One of a pair of source/drain terminals of the first offset cancellation transistor <21> is coupled to the bit line BL, the other one of the pair of the source/drain terminals of the first offset cancellation transistor <21> is coupled to the complementary read node SABLB, and a gate of the first offset cancellation transistor <21> is configured to receive an offset cancellation signal OC. The first offset cancellation transistor <21> is configured to be turned on based on the offset cancellation signal OC in the offset cancellation stage, to couple the complementary read node SABLB to the bit line BL. One of a pair of source/drain terminals of the second offset cancellation transistor <22> is coupled to the complementary bit line BLB, the other one of the pair of the source/drain terminals of the second offset cancellation transistor <22> is coupled to the read node SABL, and a gate of the second offset cancellation transistor <22> is configured to receive the offset cancellation signal OC. The second offset cancellation transistor <22> is configured to be turned on based on the offset cancellation signal OC in the offset cancellation stage, to couple the read node SABL to the complementary bit line BLB.

It should be noted that, the first isolation transistor <11>, the second isolation transistor <12>, the first offset cancellation transistor <21>, and the second offset cancellation transistor <22> may be NMOS tubes or PMOS tubes. The specific types of the first isolation transistor <11>, the second isolation transistor <12>, the first offset cancellation transistor <21>, and the second offset cancellation transistor <22> are not limited in this embodiment.

Referring to FIG. 2 and FIG. 3, in this embodiment, the amplification circuit further includes a preprocessing circuit 104 which is coupled to the read node SABL and the complementary read node SABLB. In a precharging stage, the preprocessing circuit 104 is coupled to at least one of the read node SABL or the complementary read node SABLB, and is configured to precharge the bit line BL, the complementary bit line BLB, the read node SABL, and the complementary read node SABLB to a preset voltage Vdd based on a precharge signal PRE. In an equilibrium stage, the preprocessing circuit 104 is coupled to both of the read node SABL and the complementary read node SABLB, and is configured to synchronize a node voltage of the read node SABL and a node voltage of the complementary read node SABLB based on an equilibrium signal EQ.

It should be noted that, the preset voltage Vdd is an internal power supply voltage of the memory to which the amplification circuit belongs.

Specifically, the preprocessing circuit includes a precharging transistor <31> and an equilibrium transistor <32>. One of a pair of source/drain terminals of the precharging transistor <31> is coupled to the read node SABL or the complementary read node SABLB, the other one of the pair of the source/drain terminals of the precharging transistor <31> is coupled to a node that provides the preset voltage Vdd, and a gate of the precharging transistor <31> is configured to receive the precharge signal PRE. The precharging transistor <31> is configured to be turned on based on the precharge signal PRE in the precharging stage, to precharge the bit line BL, the complementary bit line BLB, the read node SABL, and the complementary read node SABLB to the preset voltage Vdd, One of a pair of source/drain terminals of the equilibrium transistor <32> is coupled to the read node SABL, the other one of the pair of the source/drain terminals of the equilibrium transistor <32> is coupled to the complementary read node SABLB, and a gate of the equilibrium transistor <32> is configured to receive the equilibrium signal EQ. The equilibrium transistor <32> is configured to be turned on based on the equilibrium signal EQ in the equilibrium stage, to synchronize the node voltage of the read node SABL and the node voltage of the complementary read node SABLB.

It should be noted that, the precharging transistor <31> and the equilibrium transistor <32> may be NMOS tubes or PMOS tubes, and the specific types of the precharging transistor <31> and the equilibrium transistor <32> are not limited in this embodiment.

For this embodiment, compared with the manner of using the same power supply in the offset cancellation stage and the sense amplification stage, the first power supply V1 with a higher power supply voltage is provided in the offset cancellation stage in this embodiment since the power supply voltage of the first power supply V1 is higher than the power supply voltage of the second power supply V2. In such a manner, a voltage difference between the first node PCS and the second node NCS in the offset cancellation stage is increased, to increase a rate at which the sense amplification circuit 101 generates a compensation voltage before performing voltage amplification, and to eliminate a deviation caused by transistor manufacturing differences in transistor pairs inside the amplification circuit, thereby reducing the time required for completing offset cancellation. Therefore, the duration of the offset cancellation stage can be shortened based on such memory design, to optimize the performance of the memory.

In addition, compared with the manner of using the same control power supply in the offset cancellation stage and the sense amplification stage, the first control power supply VK1 with a higher power supply voltage is provided in the offset cancellation stage in this embodiment since the power supply voltage of the first control power supply VK1 is higher than the power supply voltage of the second control power supply VK2. In such a manner, a rate at which the sense amplification circuit 101 generates a compensation voltage before performing voltage amplification is increased, to eliminate a deviation caused by transistor manufacturing differences in transistor pairs inside the amplification circuit, thereby reducing the time required for completing offset cancellation. Therefore, the duration of the offset cancellation stage can be shortened based on such memory design, to optimize the performance of the memory.

It should be noted that, the characteristics disclosed in the amplification circuit provided in the foregoing embodiment may be arbitrarily combined without conflict, and a new embodiment of the amplification circuit can be obtained.

Another embodiment of this disclosure provides a control method, applied to the amplification circuit provided in the foregoing embodiment, which shortens the processing duration of the offset cancellation stage while ensuring the accuracy of offset cancellation, thereby optimizing the performance of the memory.

Figure 7:
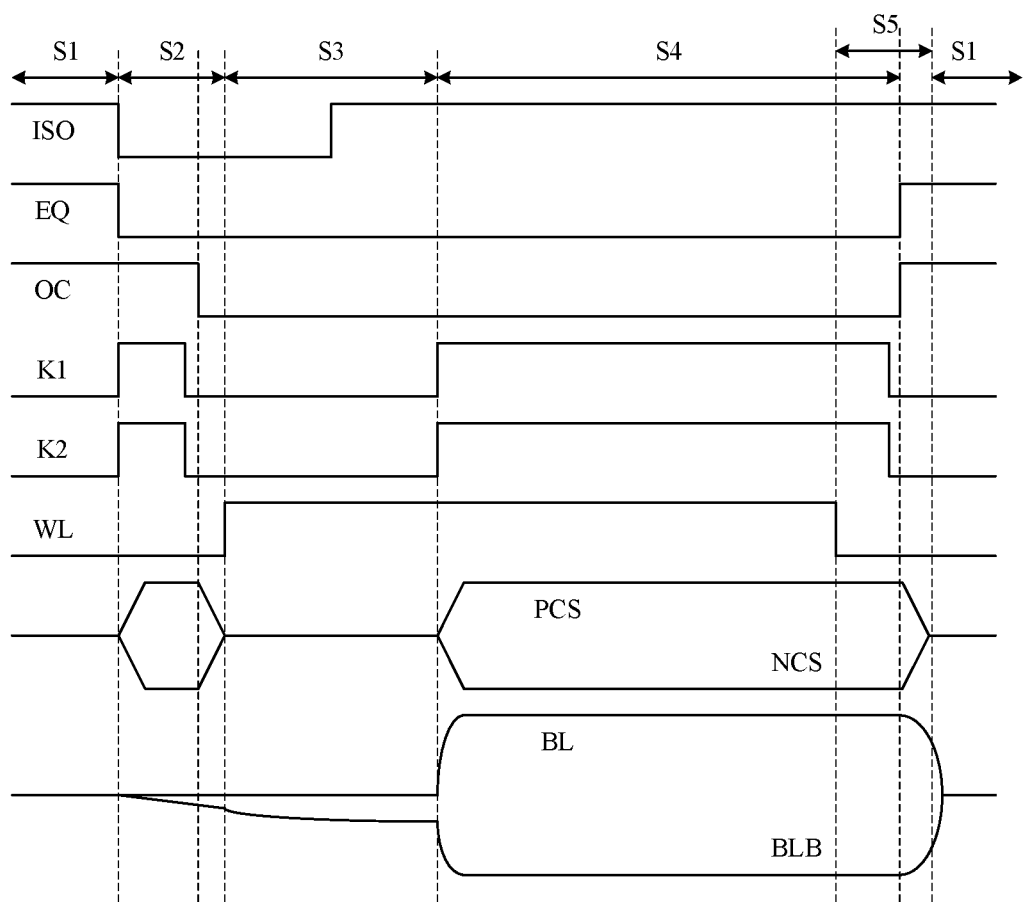
FIG. 7 is a schematic diagram of a time sequence of signals of an amplification circuit during data reading and writing according to another embodiment of this disclosure.
Figure 8:
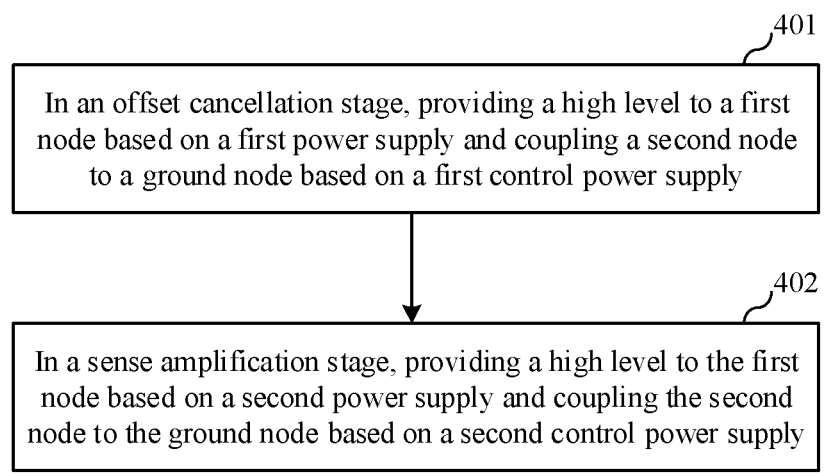
FIG. 8 is schematic flowchart of a control method according to another embodiment of this disclosure.

FIG. 7 is a schematic diagram of a time sequence of signals of an amplification circuit during data reading and writing according to this embodiment; and FIG. 8 is schematic flowchart of a control method according to this embodiment. The following further describes the control method provided in this embodiment in detail with reference to the accompanying drawings, which is specifically as follows.

Referring to FIG. 7 in together with FIG. 2 and FIG. 3, for the amplification circuit provided in the foregoing embodiment:

In a stage S1, that is, the precharging stage, the isolation signal ISO, the offset cancellation signal OC, and the equilibrium signal EQ are provided to couple the bit line BL, the complementary bit line BLB, the read node SABL, and the complementary read node SABLB to each other, and the precharge signal PRE is provided to precharge the bit line BL, the complementary bit line BLB, the read node SABL, and the complementary read node SABLB to the preset voltage Vdd.

It should be noted that, the preset voltage Vdd is an internal power supply voltage of the memory to which the amplification circuit belongs.

A stage S2, that is, the offset cancellation stage, is configured to eliminate the offset noise in the amplification circuit.

Specifically, referring to FIG. 8, in step 401, a high level is provided to the first node PCS based on the first power supply V1. The power supply voltage of the first power supply V1 is higher than the power supply voltage of the second power supply V2.

More specifically, with reference to FIG. 4, coupling of the first power supply V1 to the first control transistor <41> is controlled based on the first selection signal, and the first control transistor <41> is turned on based on the pull-up control signal K1, to couple the first power supply V1 to the first node PCS. The pull-up control signal K1 is provided by the memory to which the amplification circuit belongs.

Compared with the manner of using the same power supply in the offset cancellation stage and the sense amplification stage, the first power supply V1 with a higher power supply voltage is provided in the offset cancellation stage in this embodiment since the power supply voltage of the first power supply V1 is higher than the power supply voltage of the second power supply V2. In such a manner, a voltage difference between the first node PCS and the second node NCS in the offset cancellation stage is increased, to increase a rate at which the sense amplification circuit 101 generates a compensation voltage before performing voltage amplification, and to eliminate a deviation caused by transistor manufacturing differences in transistor pairs inside the amplification circuit, thereby reducing the time required for completing offset cancellation. Therefore, the duration of the offset cancellation stage can be shortened based on such memory design, to optimize the performance of the memory.

In some embodiments, referring to FIG. 8, step 401 further includes: the second node NCS is coupled to the ground node GND based on the first control power supply VK1, where the power supply voltage of the first control power supply VK1 is higher than the power supply voltage of the second control power supply VK2.

Specifically, with reference to FIG. 5 and FIG. 6, coupling of the first control power supply VK1 to the second control transistor <42> is controlled based on the third selection signal, and the second control transistor <42> is turned on based on the pull-down control signal K2 provided by the first control power supply VK1, to couple the ground node GND to the second node NCS.

Compared with the manner of using the same control power supply in the offset cancellation stage and the sense amplification stage, the first control power supply VK1 with a higher power supply voltage is provided in the offset cancellation stage in this embodiment since the power supply voltage of the first control power supply VK1 is higher than the power supply voltage of the second control power supply VK2. In such a manner, a rate at which the sense amplification circuit 101 generates a compensation voltage before performing voltage amplification is increased, to eliminate a deviation caused by transistor manufacturing differences in transistor pairs inside the amplification circuit, thereby reducing the time required for completing offset cancellation. Therefore, the duration of the offset cancellation stage can be shortened based on such memory design, to optimize the performance of the memory.

In a stage S3, that is, a charge sharing stage, a word line WL is turned on to connect to a corresponding storage unit, charges stored in the storage unit are shared to the bit line BL or the complementary bit line BLB, and then based on the isolation signal ISO, the bit line BL is coupled to the read node SABL, and the complementary bit line BLB is coupled to the complementary read node SABLB.

A stage S4, that is, the sense amplification stage, is configured to amplify the voltage difference between the bit line BL and the complementary bit line BLB.

Specifically, referring to FIG. 8, in step 402, a high level is provided to the first node PCS based on the second power supply V2, where the power supply voltage of the first power supply V1 is higher than the power supply voltage of the second power supply V2.

More specifically, with reference to FIG. 4, coupling of the second power supply V2 to the first control transistor <41> is controlled based on the first selection signal, and the first control transistor <41> is turned on based on the pull-up control signal K1, to couple the second power supply V2 to the first node PCS, where the pull-up control signal K1 is provided by the memory to which the amplification circuit belongs.

In some embodiments, referring to FIG. 8, step 402 further includes: coupling the second node NCS to the ground node GND based on the second control power supply VK2, where the power supply voltage of the first control power supply VK1 is higher than the power supply voltage of the second control power supply VK2.

Specifically, with reference to FIG. 5 and FIG. 6, coupling of the second control power supply VK2 to the second control transistor <42> is controlled based on the fourth selection signal, and the second control transistor <42> is turned on based on the pull-down control signal K2 provided by the second control power supply VK2, to couple the ground node GND to the second node NCS.

A stage S5, that is, the end of the sense amplification stage, is configured to read/write data.

It should be noted that, in some embodiments, the performance of the memory can be optimized only by using a solution of providing a greater power supply to the first node PCS. In some embodiments, the performance of the memory can be optimized only by coupling the second node NCS to the ground node GND based on a greater power supply. In some embodiments, the two control methods above may be implemented cooperatively to further optimize the performance of the memory.

It should be noted that, the characteristics disclosed in the control method provided in the foregoing embodiment may be arbitrarily combined without conflict, and a new embodiment of the control method can be obtained.

Yet another embodiment of this disclosure provides a memory, including the amplification circuit provided in the foregoing embodiments, where the amplification circuit is configured to perform a read/write operation of data, to shorten the processing duration of the offset cancellation stage while ensuring the accuracy of offset cancellation, thereby optimizing the performance of the memory.

Figure 9:
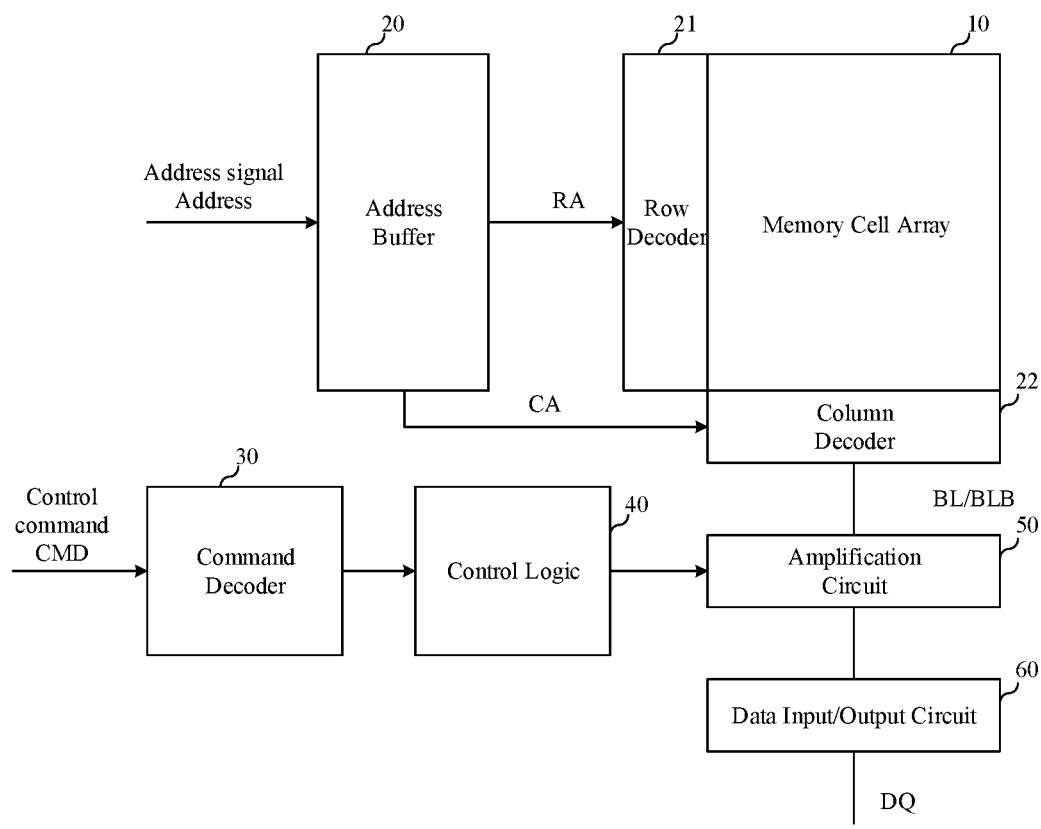
FIG. 9 is schematic structural diagram of a memory according to yet another embodiment of this disclosure.

FIG. 9 is schematic structural diagram of a memory according to this embodiment. The following further describes the memory provided in this embodiment in detail with reference to the accompanying drawings, which is specifically as follows:

Referring to FIG. 9, the memory may be a storage unit or a device based on a semiconductor device or component. For example, the memory device may be a volatile memory such as a DRAM, a synchronous DRAM (SDRAM), a double data rate synchronous DRAM (DDR SDRAM), a low power double data rate synchronous DRAM (LPDDR SDRAM), a graphics double data rate synchronous DRAM (GDDR SDRAM), a double data rate 2 synchronous DRAM (DDR2 SDRAM), a double data rate 3 synchronous DRAM (DDR3 SDRAM), a double data rate 4 synchronous DRAM (DDR4 SDRAM), or a thyristor random access memory (TRAM); or may be non-volatile memory, such as a phase-change random access memory (PRAM), a magnetic random access memory (MRAM), or a resistive random access memory (RRAM).

The memory device may input/output data by using a data line DQ in response to a control command CMD and an address signal Address received from an external device such as a memory controller. The memory device includes a memory cell array 10, a command decoder 30, a control logic 40, an address buffer 20, a row decoder 21, a column decoder 22, an amplification circuit 50, and a data input/output circuit 60.

The memory cell array 10 includes a plurality of memory cells provided in a matrix arranged in rows and columns. The memory cell array 10 includes a plurality of word lines WL and a plurality of bit lines BL connected to the memory cells. The plurality of word lines WL may be connected to the rows of memory cells, and the plurality of bit lines BL may be connected to the columns of the memory cells.

The command decoder 30 may decode a write enable signal/WE, a row address strobe signal/RAS, a column address strobe signal/CAS, a chip select signal/CS, and the like received from an external device such as a memory controller, and may allow the control logic 40 to generate a control signal corresponding to the control command CMD.

The control command CMD may include an activation command, a read command, a write command, a precharge command, and the like.

The address buffer 20 receives the address signal Address from the memory controller as an external device. The address signal Address includes row addresses RA for addressing the rows of the memory cell array 10 and column addresses CA for addressing the columns of the memory cell array 10. The address buffer 120 may send the row addresses RA to the row decoder 21 and the column addresses CA to the column decoder 22.

The row decoder 21 may select any one of the plurality of word lines WL connected to the memory cell array 10. The row decoder 21 may decode a row address RA received from the address buffer 120, select any word line corresponding to the row address RA, and activate the selected word line WL.

The column decoder 22 may select a predetermined quantity of bit lines from the plurality of bit lines BL of the memory cell array 10. The column decoder 22 may decode the column addresses CA received from the address buffer 120 and select a predetermined quantity of bit lines BL corresponding to the received column addresses CA.

The amplification circuit 50 is connected to the bit lines BL of the memory cell array 10. The amplification circuit 50 may read out a change in a voltage of a bit line selected from the plurality of bit lines BL, amplify the voltage change, and output the amplified voltage change.

The data input/output circuit 60 may output data by using the data line DQ based on the voltage read and amplified by the amplification circuit 50.

The amplification circuit 50 may receive an isolation signal ISO, an offset cancellation signal OC, and the like from the control logic 40. The amplification circuit 50 may perform an offset cancellation operation in response to the isolation signal ISO and the offset cancellation signal OC. For example, the offset represents a characteristic difference between semiconductor devices constituting the amplification circuit 50, for example, a difference between threshold voltages of different semiconductor devices.

A person of ordinary skill in the art can understand that the foregoing embodiments are specific embodiments for implementing this disclosure, and in an actual application, various changes can be made in forms and details without departing from the spirit and scope of this disclosure.

What is claimed is:

1. An amplification circuit, coupled to a bit line and a complementary bit line, and comprising:
   a sense amplification circuit, comprising a read node, a complementary read node, a first node, and a second node, wherein in a sense amplification stage and an offset cancellation stage, the first node is configured to receive a high level, and the second node is configured to receive a low level;
   an isolation circuit, coupled to the read node, the complementary read node, the bit line, and the complementary bit line, wherein the isolation circuit is configured to: in the sense amplification stage, couple the read node to the bit line and couple the complementary read node to the complementary bit line;
   an offset cancellation circuit, coupled to the read node, the complementary read node, the bit line, and the complementary bit line, wherein the offset cancellation circuit is configured to: in the offset cancellation stage, couple the bit line to the complementary read node and couple the complementary bit line to the read node; and a first power supply circuit, coupled to the first node, and comprising a first power supply and a second power supply, a power supply voltage of the first power supply being higher than a power supply voltage of the second power supply, wherein the first power supply circuit is configured to: couple the first power supply to the first node in the offset cancellation stage, and couple the second power supply to the first node in the sense amplification stage;

wherein the sense amplification circuit comprises:

a first P-type transistor, one of a pair of source/drain terminals of the first P-type transistor being coupled to the first node, the other one of the pair of the source/drain terminals of the first P-type transistor being coupled to the complementary read node, and a gate of the first P-type transistor being coupled to the read node;

a second P-type transistor, one of a pair of source/drain terminals of the second P-type transistor is coupled to the first node, the other one of the pair of the source/drain terminals of the second P-type transistor being coupled to the read node, and a gate of the second P-type transistor being coupled to the complementary read node;

a first N-type transistor, one of a pair of source/drain terminals of the first N-type transistor being coupled to the second node, the other one of the pair of the source/drain terminals of the first N-type transistor being coupled to the complementary read node, and a gate of the first N-type transistor being coupled to the bit line; and a second N-type transistor, one of a pair of source/drain terminals of the second N-type transistor being coupled to the second node, the other one of the pair of the source/drain terminals of the second N-type transistor being coupled to the read node, and a gate of the second N-type transistor being coupled to the complementary bit line, and the isolation circuit comprises:

a first isolation transistor, one of a pair of source/drain terminals of the first isolation transistor being coupled to the bit line, the other one of the pair of the source/drain terminals of the first isolation transistor being coupled to the read node, and a gate of the first isolation transistor being configured to receive an isolation signal, wherein the first isolation transistor is configured to be turned on based on the isolation signal in the sense amplification stage, to couple the read node to the bit line; and a second isolation transistor, one of a pair of source/drain terminals of the second isolation transistor being coupled to the complementary bit line, the other one of the pair of the source/drain terminals of the second isolation transistor being coupled to the complementary read node, and a gate of the second isolation transistor being configured to receive an isolation signal, wherein the second isolation transistor is configured to be turned on based on the isolation signal in the sense amplification stage, to couple the complementary read node to the complementary bit line.

2. The amplification circuit according to claim 1, wherein the first power supply circuit comprises:

a first power supply control circuit, coupled to a power supply node and the first node, wherein the first power supply control circuit is configured to couple the power supply node to the first node in the offset cancellation stage and the sense amplification stage; and a first selection circuit, coupled to the power supply node, and comprising the first power supply and the second power supply, wherein the first selection circuit is configured to: provide the first power supply to the power supply node in the offset cancellation stage, and provide the second power supply to the power supply node in the sense amplification stage.

3. The amplification circuit according to claim 2, wherein the first power supply control circuit comprises:

a first control transistor, one of a pair of source/drain terminals of the first control transistor being coupled to the power supply node, and the other one of the pair of the source/drain terminals of the first control transistor being coupled to the first node; and a pull-up control circuit, coupled to a gate of the first control transistor, wherein the pull-up control circuit is configured to turn on the first control transistor in the offset cancellation stage and the sense amplification stage.

4. The amplification circuit according to claim 2, wherein the first selection circuit comprises:

a first control subcircuit, configured to provide a first selection signal or a second selection signal based on a first control instruction;

a first selection subcircuit, coupled to the first control subcircuit, the power supply node, and the first power supply, wherein the first selection subcircuit is configured to provide the first power supply to the power supply node based on the first selection signal; and a second selection subcircuit, coupled to the first control subcircuit, the power supply node, and the second power supply, wherein the second selection subcircuit is configured to provide the second power supply to the power supply node based on the second selection signal.

5. The amplification circuit according to claim 4, wherein the first selection subcircuit comprises: a first selection transistor, one of a pair of source/drain terminals of the first selection transistor being coupled to the first power supply, the other one of the pair of the source/drain terminals being coupled to the power supply node, and a gate of the first selection transistor being coupled to the first control subcircuit and configured to receive the first selection signal; and the second selection subcircuit comprises: a second selection transistor, one of a pair of source/drain terminals of the second selection transistor being coupled to the second power supply, the other one of the pair of the source/drain terminals being coupled to the power supply node, and a gate of the second selection transistor being coupled to the first control subcircuit and configured to receive the second selection signal.

6. The amplification circuit according to claim 1, further comprising:

a second power supply control circuit, coupled to a ground node and the second node; and a second selection circuit, coupled to the second power supply control circuit, and comprising a first control power supply and a second control power supply, a power supply voltage of the first control power supply being higher than a power supply voltage of the second control power supply, wherein the second selection circuit is configured to: couple the first control power supply to the second power supply control circuit in the offset cancellation stage, and couple the second control power supply to the second power supply control circuit in the sense amplification stage; and the second power supply control circuit is configured to couple the ground node to the second node based on the first control power supply or the second control power supply.

7. The amplification circuit according to claim 6, wherein the second power supply control circuit comprises a second control transistor, one of a pair of source/drain terminals of the second control transistor being coupled to the second node, the other one of the pair of the source/drain terminals of the second control transistor being coupled to the ground node, and a gate of the second control transistor being coupled to the second selection circuit.

8. The amplification circuit according to claim 6, wherein the second selection circuit comprises:
   a second control subcircuit, configured to provide a third selection signal or a fourth selection signal based on a second control instruction;
   a third selection subcircuit, coupled to the second control subcircuit, the first control power supply, and the second power supply control circuit, wherein the third selection subcircuit is configured to provide the first control power supply to the second power supply control circuit based on the third selection signal; and
   a fourth selection subcircuit, coupled to second control subcircuit, the second control power supply, and the second power supply control circuit, wherein the fourth selection subcircuit is configured to provide the second control power supply to the second power supply control circuit based on the fourth selection signal.

9. The amplification circuit according to claim 8, wherein the third selection subcircuit comprises: a third selection transistor, one of a pair of source/drain terminals of the third selection transistor being coupled to the first control power supply, the other one of the pair of the source/drain terminals of the third selection transistor being coupled to the second power supply control circuit, and a gate of the third selection transistor being coupled to the second control subcircuit and configured to receive the third selection signal; and
   the fourth selection subcircuit comprises: a fourth selection transistor, one of a pair of source/drain terminals of the fourth selection transistor being coupled to the second control power supply, the other one of the pair of the source/drain terminals of the fourth selection transistor being coupled to the second power supply control circuit, and a gate of the fourth selection transistor being coupled to the second control subcircuit and configured to receive the fourth selection signal.

10. The amplification circuit according to claim 1, wherein the offset cancellation circuit comprises:
    a first offset cancellation transistor, one of a pair of source/drain terminals of the first offset cancellation transistor being coupled to the bit line, the other one of the pair of the source/drain terminals of the first offset cancellation transistor being coupled to the complementary read node, and a gate of the first offset cancellation transistor being configured to receive an offset cancellation signal, wherein the first offset cancellation transistor is configured to be turned on based on the offset cancellation signal in the offset cancellation stage, to couple the complementary read node to the bit line; and
    a second offset cancellation transistor, one of a pair of source/drain terminals of the second offset cancellation transistor being coupled to the complementary bit line, the other one of the pair of the source/drain terminals of the second offset cancellation transistor being coupled to the read node, and a gate of the second offset cancellation transistor being configured to receive an offset cancellation signal, wherein the second offset cancellation transistor is configured to be turned on based on the offset cancellation signal in the offset cancellation stage, to couple the read node to the complementary bit line.

11. The amplification circuit according to claim 1, further comprising a preprocessing circuit, coupled to the read node and the complementary read node, wherein
    in a precharging stage, the preprocessing circuit is coupled to at least one of the read node or the complementary read node, and is configured to precharge the bit line, the complementary bit line, the read node, and the complementary read node to a preset voltage based on a precharge signal; and
    in an equilibrium stage, the preprocessing circuit is coupled to both of the read node and the complementary read node, and is configured to synchronize a node voltage of the read node and a node voltage of the complementary read node based on an equilibrium signal.

12. The amplification circuit according to claim 11, wherein the preprocessing circuit comprises:
    a precharging transistor, one of a pair of source/drain terminals of the precharging transistor being coupled to the read node or the complementary read node, the other one of the pair of the source/drain terminals of the precharging transistor being coupled to a node that provides the preset voltage, and a gate of the precharging transistor being configured to receive the precharge signal, wherein the precharging transistor is configured to be turned on based on the precharge signal in the precharging stage, to precharge the bit line, the complementary bit line, the read node, and the complementary read node to the preset voltage; and
    an equilibrium transistor, one of a pair of source/drain terminals of the equilibrium transistor being coupled to the read node, the other one of the pair of the source/drain terminals of the equilibrium transistor being coupled to the complementary read node, and a gate of the equilibrium transistor being configured to receive the equilibrium signal, wherein the equilibrium transistor is configured to be turned on based on the equilibrium signal in the equilibrium stage, to synchronize the node voltage of the read node and the node voltage of the complementary read node.

13. A control method, applied to the amplification circuit according to claim 1, the method comprising:
    providing a high level to a first node based on a first power supply in an offset cancellation stage; and
    providing a high level to the first node based on a second power supply in a sense amplification stage, wherein a power supply voltage of the first power supply is higher than a power supply voltage of the second power supply.

14. The control method according to claim 13, comprising:
    controlling coupling of the first power supply to a first control transistor based on a first selection signal in the offset cancellation stage; and
    controlling coupling of the second power supply to the first control transistor based on a second selection signal in the sense amplification stage, wherein in the offset cancellation stage and the sense amplification stage, the first control transistor is turned on based on a pull-up control signal provided by a pull-up control power supply, to couple the first power supply or the second power supply to the first node.

15. The control method according to claim 13, further comprising:
coupling a second node to a ground node based on a first control power supply in the offset cancellation stage; and
coupling the second node to the ground node based on a second control power supply in the sense amplification stage, wherein a power supply voltage of the first control power supply is higher than a power supply voltage of the second control power supply.

16. The control method according to claim 15, comprising:
controlling coupling of the first control power supply to a second control transistor based on a third selection signal in the offset cancellation stage; and
controlling coupling of the second control power supply to the second control transistor based on a fourth selection signal in the sense amplification stage, wherein in the offset cancellation stage and the sense amplification stage, the second control transistor is turned on based on a pull-down control signal provided by the first control power supply or the second control power supply, to couple the ground node to the second node.

17. A memory, comprising an amplification circuit, wherein the amplification circuit is configured to perform a read/write operation of data and is coupled to a bit line and a complementary bit line and the amplification circuit comprises:
a sense amplification circuit, comprising a read node, a complementary read node, a first node, and a second node, wherein in a sense amplification stage and an offset cancellation stage, the first node is configured to receive a high level, and the second node is configured to receive a low level;
an isolation circuit, coupled to the read node, the complementary read node, the bit line, and the complementary bit line, wherein the isolation circuit is configured to: in the sense amplification stage, couple the read node to the bit line and couple the complementary read node to the complementary bit line;
an offset cancellation circuit, coupled to the read node, the complementary read node, the bit line, and the complementary bit line, wherein the offset cancellation circuit is configured to: in the offset cancellation stage, couple the bit line to the complementary read node and couple the complementary bit line to the read node; and
a first power supply circuit, coupled to the first node, and comprising a first power supply and a second power supply, a power supply voltage of the first power supply being higher than a power supply voltage of the second power supply, wherein the first power supply circuit is configured to: couple the first power supply to the first node in the offset cancellation stage, and couple the second power supply to the first node in the sense amplification stage;
wherein the sense amplification circuit comprises:
a first P-type transistor, one of a pair of source/drain terminals of the first P-type transistor being coupled to the first node, the other one of the pair of the source/drain terminals of the first P-type transistor being coupled to the complementary read node, and a gate of the first P-type transistor being coupled to the read node;

a second P-type transistor, one of a pair of source/drain terminals of the second P-type transistor is coupled to the first node, the other one of the pair of the source/drain terminals of the second P-type transistor being coupled to the read node, and a gate of the second P-type transistor being coupled to the complementary read node;
a first N-type transistor, one of a pair of source/drain terminals of the first N-type transistor being coupled to the second node, the other one of the pair of the source/drain terminals of the first N-type transistor being coupled to the complementary read node, and a gate of the first N-type transistor being coupled to the bit line; and
a second N-type transistor, one of a pair of source/drain terminals of the second N-type transistor being coupled to the second node, the other one of the pair of the source/drain terminals of the second N-type transistor being coupled to the read node, and a gate of the second N-type transistor being coupled to the complementary bit line, and the isolation circuit comprises:
a first isolation transistor, one of a pair of source/drain terminals of the first isolation transistor being coupled to the bit line, the other one of the pair of the source/drain terminals of the first isolation transistor being coupled to the read node, and a gate of the first isolation transistor being configured to receive an isolation signal, wherein the first isolation transistor is configured to be turned on based on the isolation signal in the sense amplification stage, to couple the read node to the bit line; and
a second isolation transistor, one of a pair of source/drain terminals of the second isolation transistor being coupled to the complementary bit line, the other one of the pair of the source/drain terminals of the second isolation transistor being coupled to the complementary read node, and a gate of the second isolation transistor being configured to receive an isolation signal, wherein the second isolation transistor is configured to be turned on based on the isolation signal in the sense amplification stage, to couple the complementary read node to the complementary bit line.

18. The memory according to claim 17, wherein the first power supply circuit comprises:
a first power supply control circuit, coupled to a power supply node and the first node, wherein the first power supply control circuit is configured to couple the power supply node to the first node in the offset cancellation stage and the sense amplification stage; and
a first selection circuit, coupled to the power supply node, and comprising the first power supply and the second power supply, wherein the first selection circuit is configured to: provide the first power supply to the power supply node in the offset cancellation stage, and provide the second power supply to the power supply node in the sense amplification stage.

19. The memory according to claim 18, wherein the first power supply control circuit comprises:
a first control transistor, one of a pair of source/drain terminals of the first control transistor being coupled to the power supply node, and the other one of the pair of the source/drain terminals of the first control transistor being coupled to the first node; and a pull-up control circuit, coupled to a gate of the first control transistor, wherein the pull-up control circuit is configured to turn on the first control transistor in the offset cancellation stage and the sense amplification stage.

* * * * *